US006538264B2

(12) United States Patent
Corbett et al.

(10) Patent No.: US 6,538,264 B2
(45) Date of Patent: *Mar. 25, 2003

(54) SEMICONDUCTOR RELIABILITY TEST CHIP

(75) Inventors: Tim J. Corbett, Boise, ID (US); Raymond P. Scholer, Boise, ID (US); Fernando Gonzalez, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/941,089

(22) Filed: Aug. 28, 2001

(65) Prior Publication Data

US 2002/0024046 A1 Feb. 28, 2002

Related U.S. Application Data

(63) Continuation of application No. 09/619,940, filed on Jul. 20, 2000, now Pat. No. 6,320,201, which is a continuation of application No. 09/298,300, filed on Apr. 23, 1999, now Pat. No. 6,157,046, which is a continuation of application No. 08/916,114, filed on Aug. 21, 1997, now Pat. No. 5,936,260, which is a continuation of application No. 08/560,544, filed on Nov. 17, 1995, now Pat. No. 5,751,015.

(51) Int. Cl.[7] .................. H01L 23/50; H01L 27/04; H01L 27/18; G01R 31/02
(52) U.S. Cl. .................. 257/48; 257/203; 257/620; 257/208; 257/210; 257/202; 257/784; 257/786
(58) Field of Search .................. 257/48, 203, 620, 257/208, 211, 202, 784, 786, 691

(56) References Cited

U.S. PATENT DOCUMENTS 3,746,973 A   7/1973   McMahon, Jr.
3,803,483 A   4/1974   McMahon, Jr.

(List continued on next page.)

FOREIGN PATENT DOCUMENTS

| JP | 1-100936 | 4/1989 |
|---|---|---|
| JP | 3-82129 | 4/1991 |
| JP | 4-7865 | 1/1992 |
| JP | 5-29546 | 2/1993 |
| JP | 5-343525 | 12/1993 |
| JP | 6-77299 | 3/1994 |

OTHER PUBLICATIONS

Shirley et al.; "A Technique for Electrical Measurement of Ball Bond Location"; Proceedings of the 38th Electronics Components Conference of the IEEE; 1988; pp. 564–569.

Sweet; "The Use of Special Purpose Assembly Test Chips for Evaluating Reliability in Packaged Devices"; WLR Workshop; Jul. 27, 1992; pp. 1–3.

Primary Examiner—Alexander O. Williams
(74) Attorney, Agent, or Firm—TraskBritt

(57) ABSTRACT

A semiconductor test chip including a plurality of test functions. The test functions of the semiconductor test chip include bond pad pitch and size effects on chip design, wire bond placement accuracy regarding placement of the wire bond on the bond pad, evaluation of bond pad damage (cratering) effect on the area of the chip below the bond pad during bonding of the wire on the bond pad, street width effects regarding the use of thinner saw cuts in cutting the individual chips from the wafer, thermal impedance effects for thermal testing capabilities, ion mobility evaluation capabilities and chip on board in flip chip application test capabilities.

44 Claims, 9 Drawing Sheets

U.S. PATENT DOCUMENTS

| | | |
|---|---|---|
| 4,255,672 A | 3/1981 | Ohno et al. |
| 4,360,142 A | 11/1982 | Carpenter et al. |
| 4,420,722 A | 12/1983 | Todd |
| 4,599,576 A | 7/1986 | Yoshida et al. |
| 4,992,845 A | 2/1991 | Arakawa et al. |
| 5,059,899 A | 10/1991 | Farnworth et al. |
| 5,068,603 A | 11/1991 | Mahoney |
| 5,157,476 A | 10/1992 | Yoshida |
| 5,214,657 A | 5/1993 | Farnworth et al. |
| 5,326,428 A | 7/1994 | Farnworth et al. |
| 5,329,228 A | 7/1994 | Comeau |
| 5,341,685 A | 8/1994 | Malone |
| 5,347,150 A | 9/1994 | Sakai et al. |
| 5,351,001 A | 9/1994 | Kornrumpf et al. |
| 5,365,091 A | 11/1994 | Yamagishi |
| 5,399,914 A | 3/1995 | Kozono |
| 5,414,351 A | 5/1995 | Hsu et al. |
| 5,448,088 A | 9/1995 | Nagai et al. |
| 5,455,460 A | 10/1995 | Hongo et al. |
| 5,466,956 A | 11/1995 | Aeba |
| 5,481,125 A | 1/1996 | Harris |
| 5,489,538 A | 2/1996 | Rostoker et al. |
| 5,528,083 A | 6/1996 | Malladi et al. |
| 5,723,906 A | 3/1998 | Rush |
| 5,757,082 A | 5/1998 | Shibata |
| 5,801,450 A | 9/1998 | Barrow |
| 5,923,047 A | 7/1999 | Chia et al. |
| 5,939,790 A | 8/1999 | Gregoire et al. |

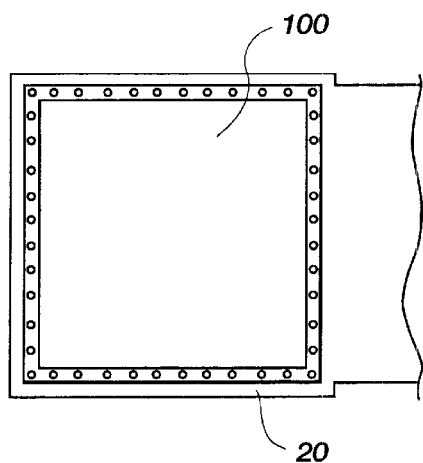
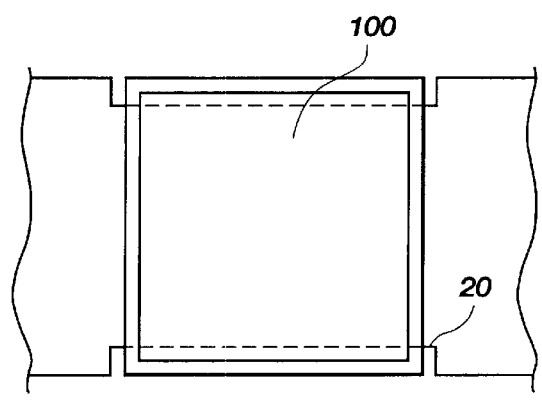
Fig. 3A  Fig. 3B
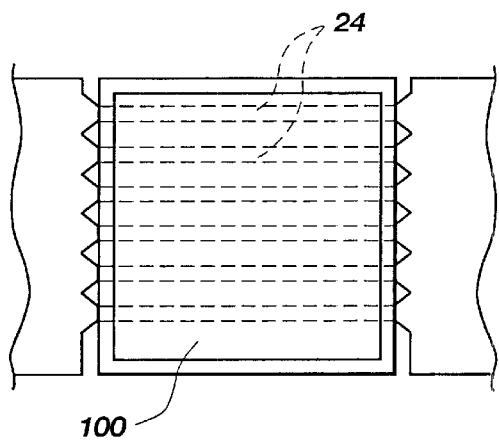
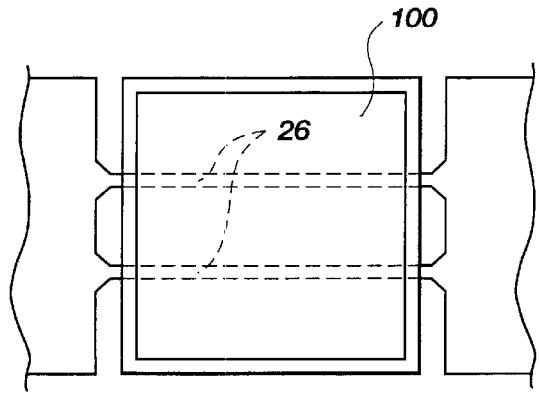
Fig. 3C  Fig. 3D
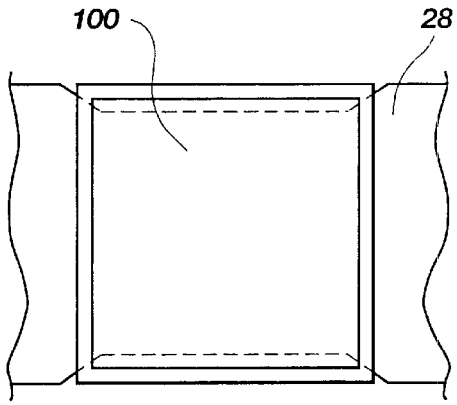
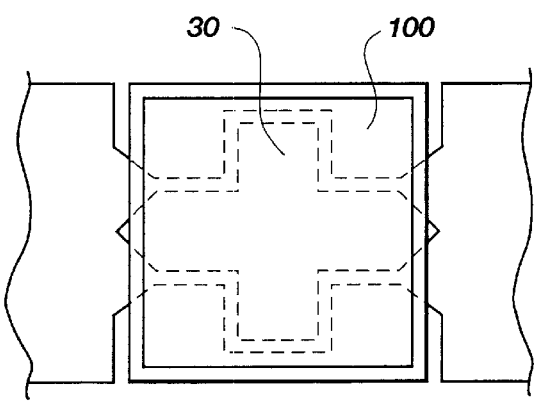
Fig. 3E  Fig. 3F

SEMICONDUCTOR RELIABILITY TEST CHIP

CROSS REFERENCE TO RELATED APPLICATIONS

This application is a continuation of application Ser. No. 09/619,940, filed Jul. 20, 2000, now U.S. Pat. No. 6,320, 201, issued Nov. 20, 2001, which is a continuation of application Ser. No. 09/298,300, filed Apr. 23, 1999, now U.S. Pat. No. 6,157,046, issued Dec. 5, 2000, which is a continuation of application Ser. No. 08/916,114, filed Aug. 21, 1997, now U.S. Pat. No. 5,936,260, issued Aug. 10, 1999, which is a continuation of application Ser. No. 08/560, 544, filed Nov. 17, 1995, now U.S. Pat. No. 5,751,015, issued May 12, 1998.

BACKGROUND OF THE INVENTION

1. Field of the Invention

The present invention relates to a semiconductor reliability test chip. More specifically, the present invention relates to a semiconductor reliability test chip including a plurality of test functions.

2. State of the Prior Art

Typically, the reliability of semiconductor products has been tested by operating the semiconductor products in a variety of life accelerating environments over periods of time until the components fail. Subsequently, the semiconductor components are inspected and tested electrically in an attempt to determine the cause of failure. Since there are many reasons for the failure of semiconductor components, the analysis of failed components can be lengthy and difficult. Attempts have been made to design semiconductor test chips or dies to assess a specific type of failure of the semiconductor component. An article by J. S. Sweet, entitled "The Use of Special Purpose Assembly Test Chips for Evaluating Reliability In Packaged Devices", published by Sandia National Laboratory, pages 15–19, describes some of these types of chips. The article describes a series of individual special purpose assembly test chips to aid in assessing the reliability of packaged integrated circuits. The special purpose assembly test chips contain special purpose circuits or sensors which enhance the detection of failures or detect moisture, detect mobile ions, or other contaminants which can lead to failure of the semiconductor component.

In U.S. Pat. No. 5,414,351, a method is described for testing the reliability of terminals in a semiconductor package by placing a test chip in the package wherein the test chip has an insulating substrate, a passivating layer over the metal layer provided with a plurality of openings, a plurality of Gold (Au) terminals in the openings bonded to the metal layer and a master ground terminal bonded to the metal layer. Input/Output (I/O) terminals are provided in the package structure for each of the Au terminals, master terminals are connected to the I/O terminals with wire, and the test chip is sealed in a package. The resistance of each terminal is monitored to determine any change of electrical resistance, which is an indication of terminal deterioration.

U.S. Pat. No. 5,329,228 discloses a semiconductor test chip for use in semiconductor fabrication fault analysis comprising an n×m array of transmission gate cells arranged such that, within a given row, respective strips of conductive material of a first type form common source and drain electrodes for the transistors of the row. The sources and drains of each row are independent and within a column of strips of conductive material of a second type forming common gate electrodes such that each column of transistors can be turned on independently. The results of the semiconductor test chip are useful for characterizing process yields and reliability as well as useful for high level yield modeling.

U.S. Pat. No. 5,326,428 describes a method of engaging electrically conductive test pads on a semiconductor substrate having integrated circuitry to test the operability thereof. The patent further describes a test probe suitable for use with the substrate.

U.S. Pat. No. 5,214,657 describes circuitry to enable dicing of a wafer of semiconductor chips. The circuitry is included in the street area of the chips forming the wafer.

U.S. Pat. No. 5,059,899 discloses a method for producing individual semiconductor chips from wafers, wherein the test pads for the testing of individual dies or chips are formed in the scribe or street area of the chip.

U.S. Pat. No. 4,420,722 discloses a technique for testing for heavy metal contamination in semiconductor processing furnaces through the use of a specially designed semiconductor chip having a plurality of PN-junctions, at least one of which is completely isolated from the sides of the chip. The specially designed semiconductor chip is manufactured to exhibit a high reverse recovery time which is measured and compared to determine if it has decreased over time.

U.S. Pat. No. 4,360,142 discloses the use of dummy semiconductor chips in developing improved solder bonds.

U.S. Pat. Nos. 3,746,973, 3,803,483, and 5,341,685 disclose the use of test chips to test semiconductor chips or apparatus for use in the testing of lead tab bonds and semiconductor chips.

In contrast to the prior art, a more comprehensive type test chip is desirable to facilitate evaluation of the effects of bond pad spacing and size on manufacturing and bond integrity. Also, a test chip is needed to study the bonding effects of the use of thinner metal layers forming the bond pads and the effects of the use of films beneath the metal of bond pads as stress buffers during wire bonding. Further, a test chip is needed to study the thermal effects of the chip in a variety of packaging arrangements. Additionally, a test chip is needed to study the effects of ion mobility in conventional thick and thin film type gate structures including having a temperature measurement capability therewith.

BRIEF SUMMARY OF THE INVENTION

The present invention is directed to a semiconductor test chip including a plurality of test functions. The test functions of the semiconductor test chip of the present invention include bond pad pitch and size effects on chip design, wire bond placement accuracy relating to placement of the wire bond on the bond pad, evaluation of the effect of bond pad damage on the area of the chip below the bond pad during bonding of the wire on the bond pad (cratering), street width effects regarding the use of thinner saw cuts in cutting the individual chips from the wafer, thermal impedance effects for thermal testing capabilities, ion mobility evaluation capabilities, and chip on board in flip chip application test capabilities. A substantially square die is used in the present invention to provide the maximum assembly flexibility with lead frames.

BRIEF DESCRIPTION OF THE SEVERAL VIEWS OF THE DRAWINGS

The advantages of the present invention will be better understood when the written description provided herein is taken in conjunction with the drawings wherein:

FIGS. 3A–3F are schematic views of the types of shapes of the polysilicon layer located beneath the second row of bond pads of the bond pad test chip of the present invention;

DETAILED DESCRIPTION OF THE INVENTION

Figure 1:
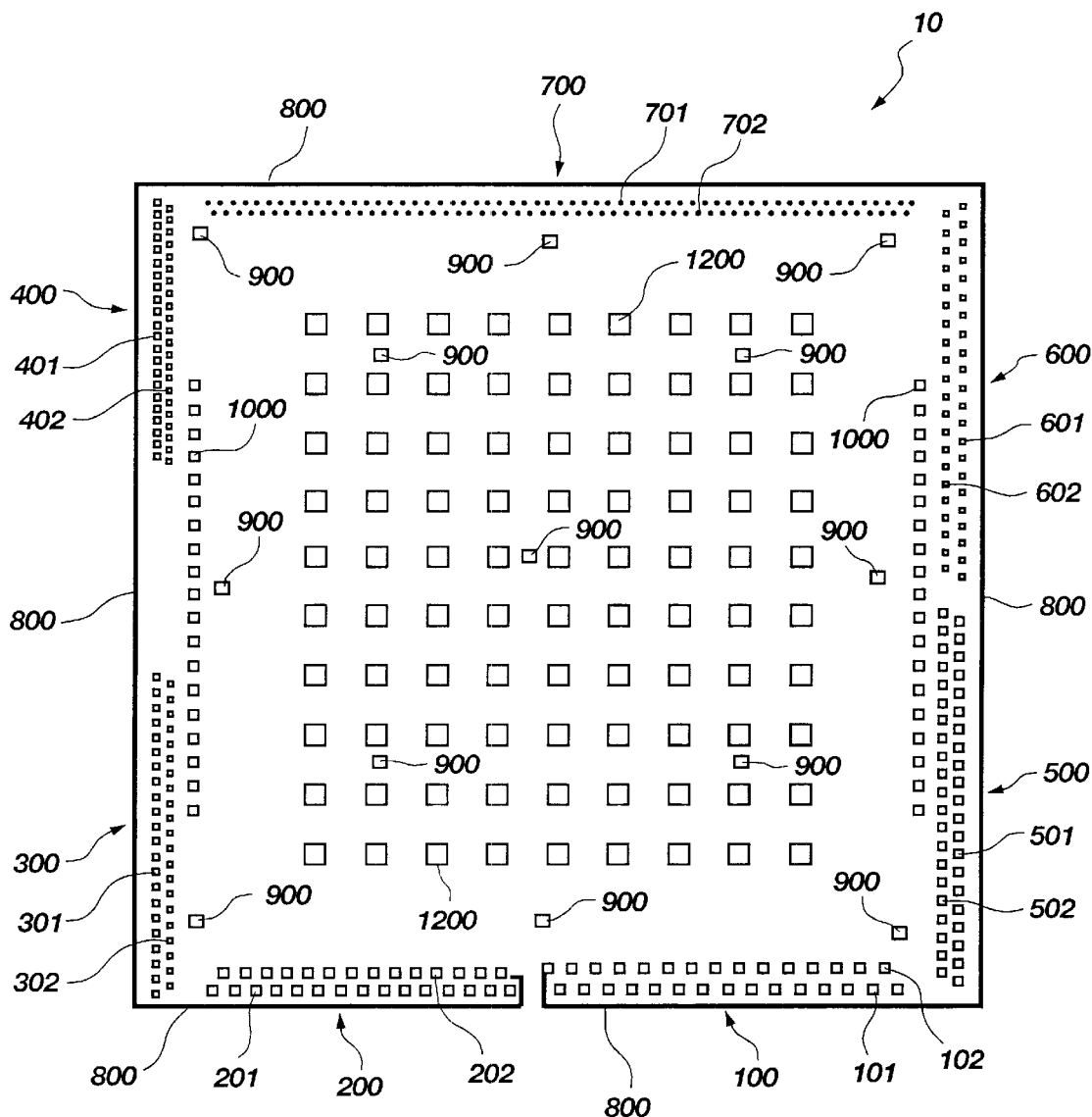
FIG. 1 is a top view of the bond pad test chip of the present invention with the conductive paths removed for clarity.

Referring to drawing FIG. 1, the bond pad reliability test chip 10 of the present invention is shown in a preferred embodiment. The test chip 10 of the present invention comprises a typical MOS type semiconductor chip including a predetermined variety of integrated circuits to perform the desired test functions hereinafter described.

The test chip 10 includes a plurality of bond pads located about its periphery in varying size and pitch for the testing of bond pad pitch and size in relation to the size of the diameter of the wire being bonded thereto to evaluate the wire bond to pad performance, as well as evaluating the location of the wire bond on the bond pad. For the evaluation of such effects, bond pads 100 are preferably located in two rows having a square size of 4.5 mils. located on a pitch of 8.0 mils., bond pads 200 are preferably located in two rows having a square size of 4.0 mils. located on a pitch of 7.0 mils., bond pads 300 are preferably located in two rows having a square size of 3.0 mils. located on a spacing of 5.0 mils., bond pads 400 are preferably located in two rows having a square size of 3.0 mils. located on a spacing of 4.0 mils., bond pads 500 are preferably located in two rows having a square size of 3.5 mils. located on a spacing of 6.0 mils., bond pads 600 are preferably located in two rows having a square size of 2.5 mils. located on a spacing of 6.0 mils., and bond pads 700 are preferably located in two rows being round in shape and having a diameter of 2.0 mils. located on a spacing of 4.0 mils. The various groups of referenced bond pads are located substantially about the periphery of the test chip 10 as shown. If desired, the various groups of bond pads may be placed in differing locations about the periphery of the test chip 10.

In each series of bond pads 100, 200, 300, 400, 500, 600, and 700 for test purposes, gold wire having a nominal diameter of 1.2 mils., 1.0 mils., 0.8 mils., 0.7 mils., or any desired size wire diameter to be evaluated in relation to the bond pads is bonded to predetermined bond pads to assess the effects of bond pad size and wire diameter upon the performance of the bond pad junction.

If desired, a passivation overlap of 5.0 microns may be used on all bond pads 100, 200, 300, 400, 500, 600 and 700. Further, predetermined pairs (not shown) of bond pads, as desired, are connected by aluminum lines to verify wire bond continuity and to verify that no shorts to neighboring wires have occurred. All bond pads, regardless of their respective size and pitch, preferably have the same spacing from the pad edge to the street edge of the test chip. Additionally, a 6.0 micron aluminum line (not shown) is preferably run around the perimeter of each group of bond pads having the same size and pitch, with the aluminum line preferably having a 5.0 micron bond pad metal to line spacing. The 6.0 micron line width allows a 2.0 micron passivation to metal overlap, leaving approximately 4 microns exposed or unpassivated portion of the line. The unpassivated portion of the line increases the likelihood of detection of a short or leakage if any wire ball bond is misaligned or misplaced with respect to any bond pad of interest.

In each group of bond pads, the first rows of bond pads 101, 201, 301, 401, 501, 601, and 701, respectively, of each group of bond pads are formed conventionally on the test chip 10. The second rows of bond pads 102, 202, 302, 402, 502, 602, and 702, respectively, of each group of bond pads are located behind the first row of pads and are formed on the test chip 10 having the same size and pitch as the pads in the first rows. However, the second rows of bond pads 102, 202, 302, 402, 502, 602 and 702 contain varying types of configurations of polysilicon under the bond pad structures to increase the sensitivity of detecting damage under the bond pad from the wire bond/bond pad formation (cratering effects demonstrated by the test chip). Any desired type of configuration of polysilicon structure under the predetermined bond pad may be used to evaluate the damage to the structure, depending upon the predetermined structure's desired response characteristics to any anticipated damage. It is well known that such damage effects during bonding are subsequently detected as a change in the resistance of the polysilicon structures located beneath the bond pad structure of interest. It is understood that multiple different types of polysilicon structures, such as serpentine shaped, solid sheet type, right angle type, etc., are used under the bond pad to detect different types of problems. Further, it is understood that damage of the polysilicon structure is detectable by measuring the leakage from the metal pad to the polysilicon by electrical measurements of the damaged dielectric.

Spaced about the periphery of the test chip 10 are a series of predetermined width lines 800 in the street or scribe area of the chip to simulate various street widths and to evaluate any damage to the test chip 10 during sawing of the test chip 10 from the wafer of chips. The series of lines 800 is preferably a series of five parallel aluminum lines having a spacing of 0.25 mils. increments to simulate 4.0, 4.5, 5.0, 5.5, and 6.0 mils. street widths of the series of lines 800. One end of the series of lines 800 is commonly connected electrically while the other end of the series of lines 800 is connected to predetermined separate bond pads for the capability of making independent continuity measurements. Typically, any defect in this area of the test chip severs or damages one or more of the aluminum lines, of the series of lines 800 causing an electrical open occurrence. Additionally, one side of the test chip 10 is preferably passivated to study the effects of saw performance or the quality of the saw cut on the passivated streets 800. This series of multiple lines on street width test chip of the present invention is in contrast to the typical street or scribe width of approximately 5.0 to 7.0 mils. for the conventional semiconductor chip or die which contains no such test capabilities in the street or scribe area. It is understood that damage to the lines 800 by any saw cutting is also measured or detectable by conventional well known electrical measurements in addition to those methods described hereinbefore.

As previously stated, the semiconductor test chip 10 of the present invention is further capable of responding to the effect of the "cratering" or breakage of the material beneath the bond pad from the wire bond/pad formation of the connection. Ohmic contact to a polysilicon sheet running beneath the second row of bond pads of each group of bond pads provides a means to detect damage in the layers of the test chip 10 under the bond pads. Any fractures or cracks are electrically detectable by measuring the leakage between the metal forming the pad and the underlying polysilicon through the use of suitable well known techniques. Alternately, measuring the resistance change in the polysilicon sheet through the use of well known techniques may be used as a method of detecting any damage to the area of the test chip 10 located beneath the predetermined bond pad of interest. If desired, a serpentine shaped, elongated transistor, or any other desired shape suitable for detection use, may be placed below the bond pad of interest to measure the damage to the bond pad through monitoring the transistor source and drain. Through the use of such techniques, characterization of the bond pad stack as formed by its various components (aluminum metal thickness & barrier metal thickness, boron-phosphorous-silicate-glass and dopant concentration films (BPSG films), film strengths (either compressive or tensile), polysilicon thickness and dopant concentrations and/or process effects (such as annealing temperature), wire bonding process variables, etc.) including the portions of the test chip 10 located therebelow are made, thereby allowing the reliability of the performance of the various bond pad stacks to be measured as well as quantified.

The semiconductor test chip 10 of the present invention is also used to determine the effect of the bond position structure of the wire bond/pad by using individual preselected or predetermined bond pads of the groups of bond pads described hereinbefore, 100, 200, 300, 400, 500, 600, and 700 respectively. The wire bond placement accuracy is measured electrically to provide the wire bond/pad placement accuracy, typically to within 2.0 microns of its placement on the bond pad. The technique used is described in "A Technique for Electrical Measurement of Ball Bond Location", authored by C. G. Shirley and S. Gupta in the 1988 Proceedings of the 38th Electronics Components Conference of the IEEE, pages 564–569. Another function of the gold-aluminum intermetallic formations of the wire to bond pad bond is measured and monitored by the test chip 10 of the present invention. Such function is described and set forth later in the specification. Briefly stated, the growth of the intermetallic compound (IMC) at the junction of the aluminum layer and gold wire bond is monitored electrically to observe the growth of the IMC in situ since as the IMC grows, the electrical properties of the aluminum layer change.

The semiconductor test chip 10 of the present invention further includes the capability of testing the response of the test chip 10 to heat for the evaluation of various performance characteristics of the test chip 10. The test chip 10 includes any desired number of polysilicon resistors 900, so that the thermal performance of the test chip may be studied in a variety of packaging. Two temperature measurement techniques are available to study the effect of temperature in a predetermined packaging configuration; i.e., the traditional junction diode voltage and an aluminum resistor. A desired predetermined number of transistors (PN junctions) contained within the test chip 10 preferably provides for at least five point measurements to be conducted across the entire test chip 10 or preferably provides at least five point thermal measurements in any single quadrant of the test chip 10, thereby providing the capability of determining comprehensive temperature gradients across any quadrant of the test chip 10.

A plurality of polysilicon resistors 900 are placed in desired predetermined locations of the test chip 10 so that the source of heat can be predetermined to any desired portion at any desired level of the test chip 10 to study the package thermal behavior and to simulate potential "hot spots." The polysilicon resistors 900 are, in turn, connected to desired predetermined pads 1000 located on the test chip 10 for their actuation during testing.

To measure the temperature effects of the polysilicon resistors, a desired predetermined number of junction diode temperature sensors are included in the test chip 10 and may be the source or drain of typical nominal filled transistors contained within the test chip 10.

If required, a PN junction of any "thin or thick gate" transistors included in the test chip 10 may also be used for temperature measurements of the test chip 10. Common gates and sources of such transistors provide additional independent devices for transistors' Vt measurements across the test chip 10. It should be understood that dummy contact pads similar to those shown as 1000 may be added to the test chip 10 of the present invention, as desired. Such dummy pads are added on each side of the test chip 10 to evaluate the heat transfer effects of heat being transferred by the combination of the bond wires and bond pads from the test chip 10 to the leadframe when the test chip is encapsulated in plastic in any desired packaging configuration to be evaluated.

Furthermore, the flip chip pads 1200 described hereinafter provide, essentially, an unpassivated contamination test chip containing field silicon dioxide, commonly referred to as "ox," and thin and thick gated devices to be used as a contamination monitor of portions of the test chip 10. The thin gate transistors, thick gate transistors, and PN junction temperature sensors function as a system included in the test chip 10 that allows the measurement of contamination in two different ranges or magnitudes while simultaneously correlating the mobility activity as a function of temperature, thereby allowing a user to realize peak mobility activity versus temperature of the test chip 10.

Included in the test chip 10 is an array of flip chip test pads 1200 in the center of the test chip 10. The array is preferably a 9×10 array of flip chip pads 1200 for a substantially square test chip of approximately 0.275 inches per side. For such a size test chip 10, each flip chip test pad is preferably an 8 mils. square located on a 20 mils. pitch. In this manner, the passivation overlap is preferably 10 microns. The flip chip test pads 1200 are configured to allow a daisy chain continuity measurement between any test die and complementary designed flip-chip substrate (PCB). Each annular series of the 9×10 array of the flip chip test pads 1200 is configured as a separate circuit pair in order to study differences between full array bonding versus only perimeter bonding. A suitable single in-line memory module style printed circuit board (SIMM style PCB) may be used to be complementary to the flip chip test pads 1200 to allow the daisy chain measurements. The polysilicon heaters from a suitable mating test chip may be connected to two predetermined flip chip test pads so that the test chip 10 can be heated during flip chip reliability testing. Also, if desired, the contact pad to contact pad leakage on adjacent pads of the test chip 10 may be measured by either annular ring to annular ring or contact pad to contact pad within a ring through the use of the test chip 10 of the present invention.

As an example of the components of the various levels of the test chip 10 of the present invention, as generally contemplated, a first level comprises an N+ diodes location, a second level comprises the polysilicon/silicide stack under the bond pads, a third level includes via cuts so that contact is made to the polysilicon and N+ diodes, a fourth level comprises a single metal level, a fifth level includes a second metal level, a sixth level comprises a level to put glass over metal and, optionally, a seventh level comprises a pattern of extra metal added to pads or for a spin-on die coat. These various examples of the levels of the test chip and the location of various features of the present invention may be varied or modified as desired while preserving the various test capabilities and function of the test chip 10 of the present invention. Additionally, more levels may be added to the test chip as desired.

Figure 2A:
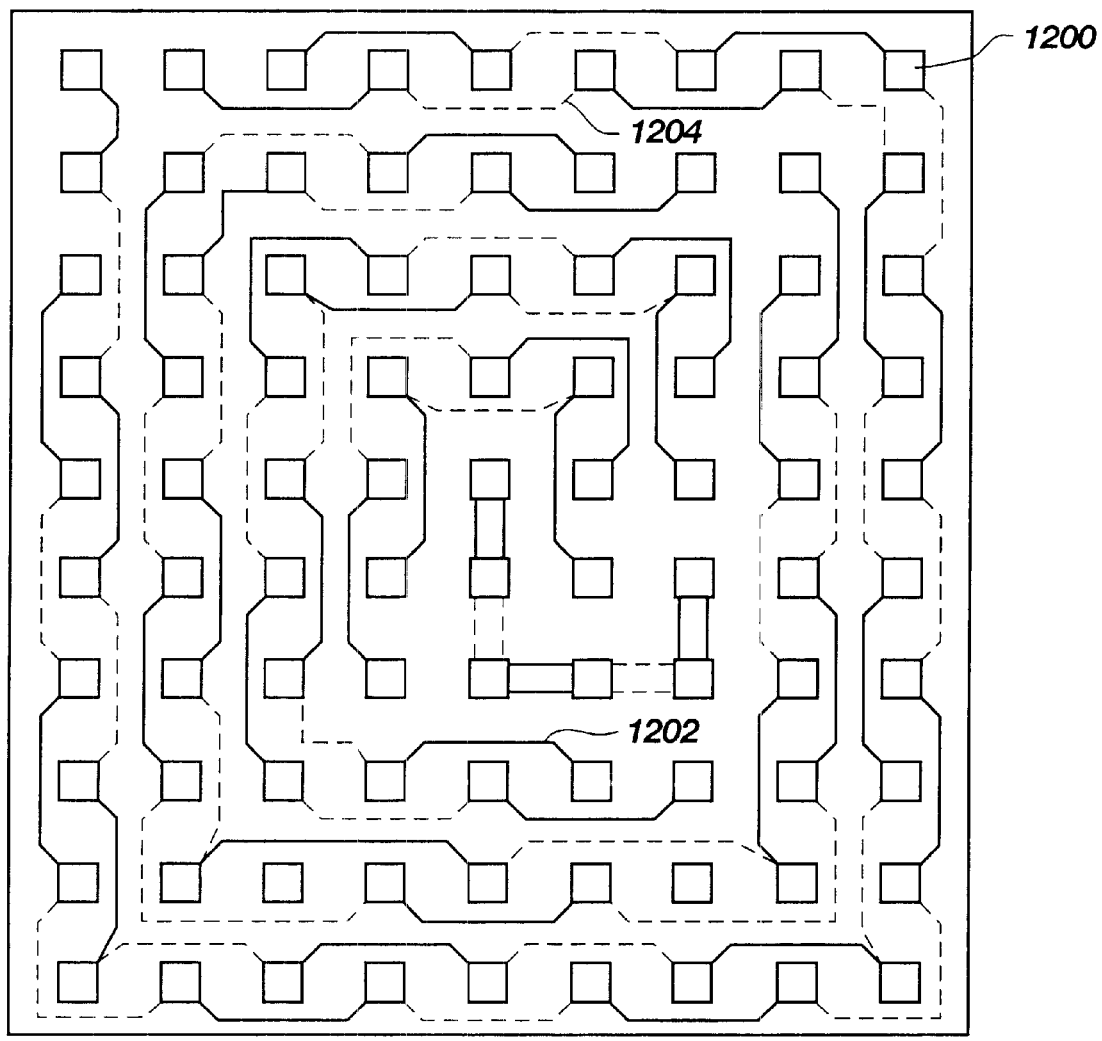
FIGS. 2A and 2B are views of the test pad interconnection portion of the bond pad test chip, specifically for flip chip interconnection technologies, of the present invention.

Referring to drawing FIG. 2A, the 9×10 array of flip chip test pads 1200 is illustrated with the metal conductor connections between individual flip chip test pads 1200 being shown in solid lines 1202, while the printed circuit board predetermined connections are shown in dotted lines 1204.

Figure 2B:
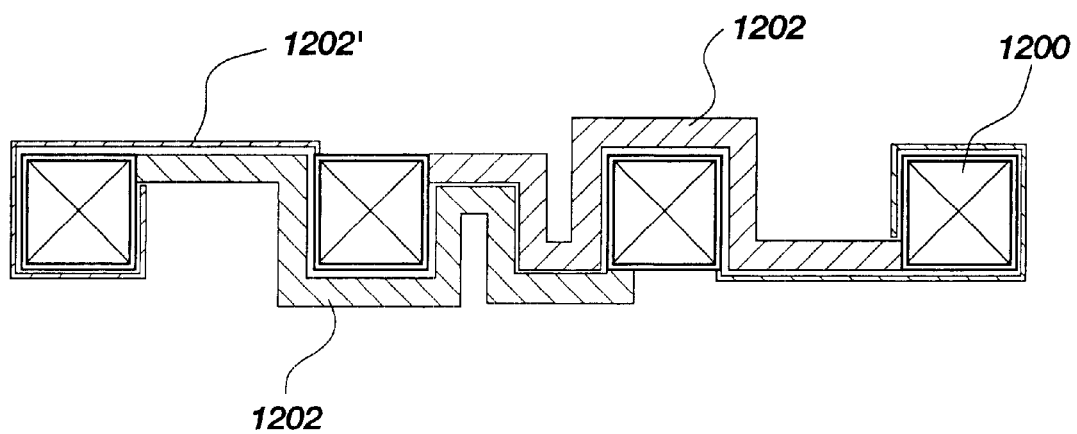

Referring to drawing FIG. 2B, the conductor lines 1202 between predetermined individual flip chip test pads 1200 as well as the sense lines 1202' between predetermined flip chip test pads 1200 are shown. The conductor lines are preferably 50 microns wide while the sense lines are preferably 10 microns wide. All conductor line to sense line spacing is preferably 5 microns.

Referring to drawing FIGS. 3A through 3F, various types of bond pad configurations in relationship to the polysilicon located therebelow are shown. Drawing FIG. 3A shows a bond pad 100 with perimeter contacts with a polysilicon pad 20 extending beyond the pad 100. Drawing FIG. 3B shows adjacent bond pad 100 with the same polysilicon pad 20 extending under less than the entire pad 100. Drawing FIG. 3C shows a bond pad 100 having multiple lines of polysilicon 24 extending below the bond pad. Drawing FIG. 3D shows a bond pad 100 having a dual line of polysilicon 26 extending below the bond pad. Drawing FIG. 3E shows a solid sheet of polysilicon 28 extending below the bond pad. Drawing FIG. 3F shows a cross-shaped portion of polysilicon 30 extending below approximately 90% of the bond pad 100. These are typical examples of the types of shapes of polysilicon extending below either the square or round shaped bond pads located in the second rows of each group of bond pads 100, 200, 300, 400, 500, 600, and 700 respectively of the semiconductor test pad of the present invention.

Figure 4:
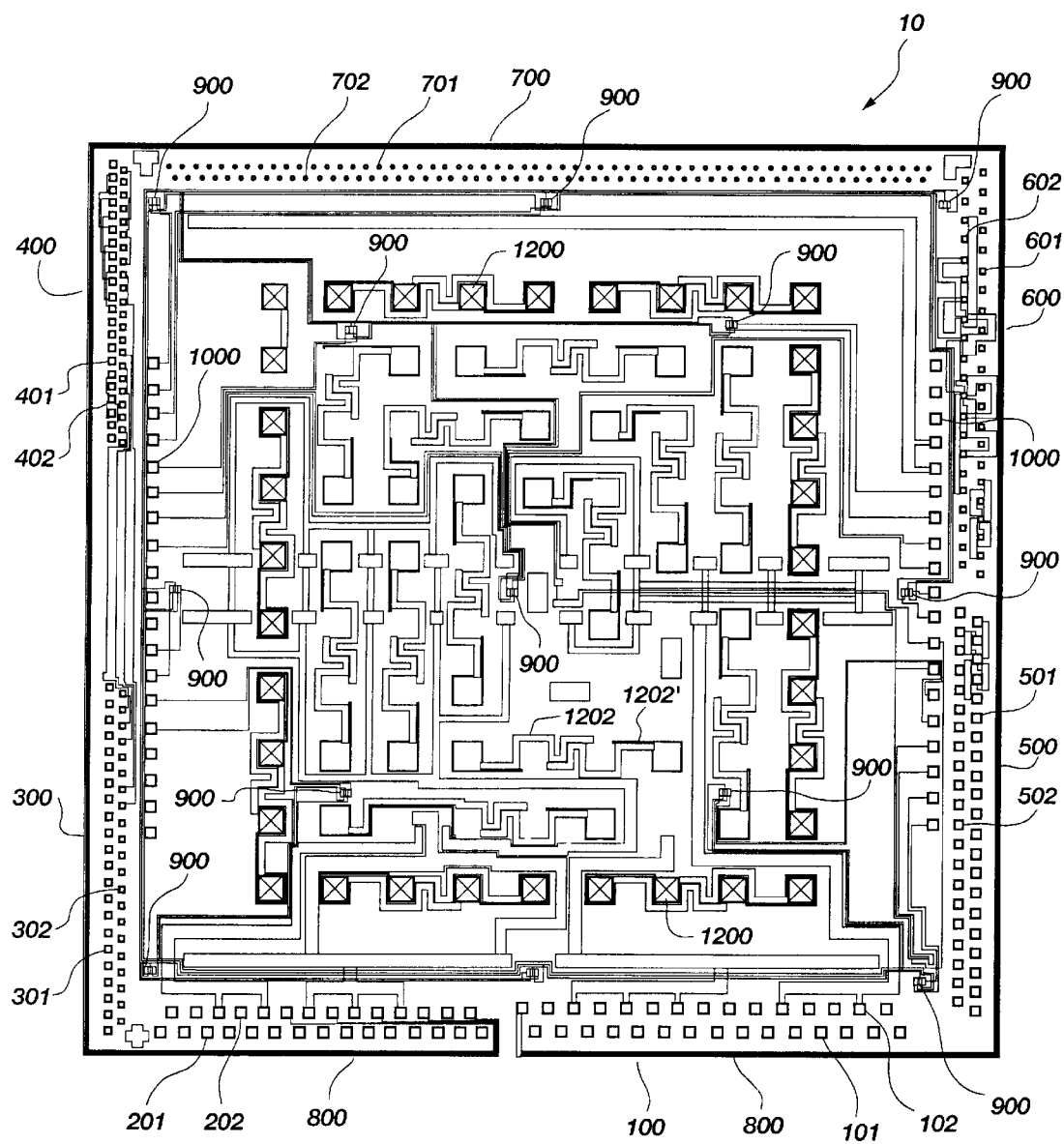
FIG. 4 is a top view of the semiconductor test chip of the present invention with conductive paths illustrated.

Referring to drawing FIG. 4, the test chip 10 of the present invention is shown in its preferred embodiment with circuit lines included in a typical engineering layout drawing. The various features of the test chip 10 described hereinbefore are shown as they appear as indicated by the engineering symbols therefor. As such, the various test features of the test chip 10 are clearly indicated by the drawing numbers relating to those features as hereinbefore described.

Figure 5A:
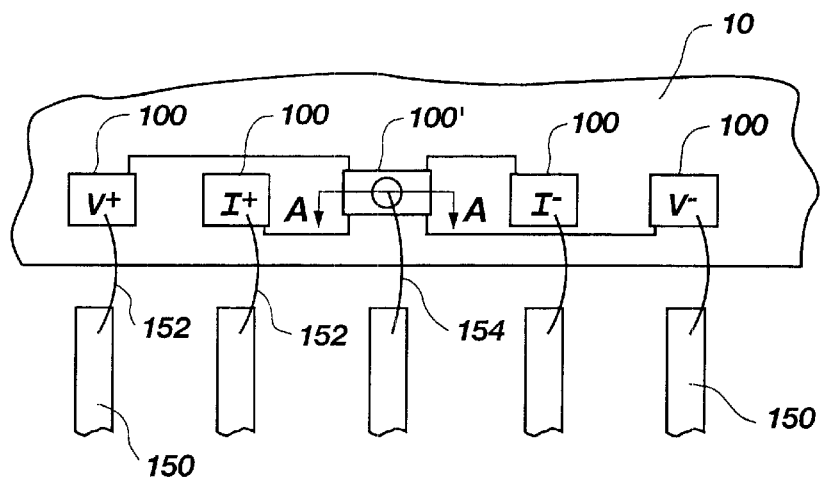
FIGS. 5A–5C are views of a wire bond to a contact pad arrangement of the semiconductor test chip of the present invention.

Referring to drawing FIG. 5A a portion of the test chip 10 is shown in a configuration to allow the measurement of the resistance of the aluminum layer located under the gold wire ball bond to the appropriate contact pad. A plurality of bond pads 100 are shown being interconnected to the plurality of leadframe fingers 150 by way of wires 152. The bond pad 100' of interest to evaluate the characteristics of the gold wire bond 154 to the aluminum layer of the bond pad 100' is shown. The aluminum and gold diffuse over time at the junction thereof, thereby forming an intermetallic compound (IMC) which, in turn, grows and consumes the aluminum at the interface of the material. As more and more of the thin film aluminum of the bond pad is converted to IMC, the electrical properties of the aluminum layer change. By electrically monitoring and observing the IMC growth in situ using well known techniques, the characteristics of the wire/pad bond may be determined for evaluation purposes of the bond. In this manner many items that affect, both positively and negatively, the growth and development of the IMC structure at the bond interface that are critical to the aluminum and gold wire bond reliability may be evaluated by the test chip 10 of the present invention.

Figure 5B:
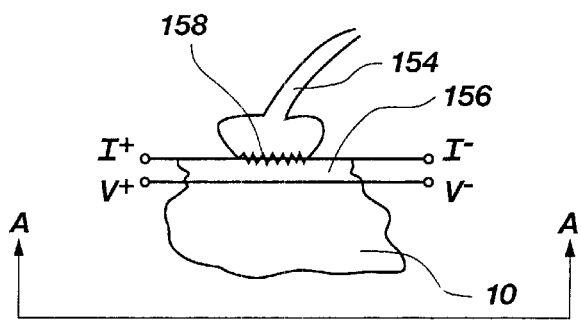

Referring to drawing FIG. 5B, a low resistance IMC interface 158 formed between the gold wire 154 and aluminum layer 156 of the bond pad 100' is shown. The low resistance of the IMC interface 158 results from little time passing from the time of bonding of the gold wire 154 to the bond pad 100' and the junction being subjected to little heat. As shown in drawing FIGS. 5A and B, the voltage and current measurements of the aluminum layer 156 and the interface bond with the gold wire 154 are monitored from adjacent bond pads 100 through interconnections of the bond pad 100' and the adjacent bond pads 100.

Figure 5C:
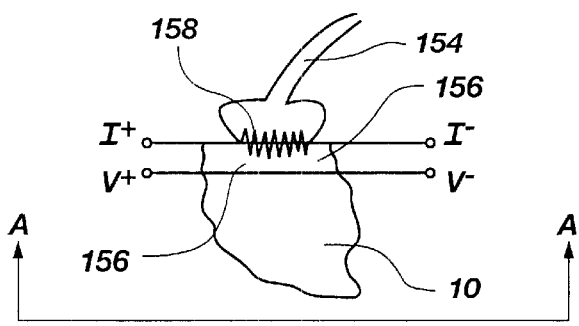

Referring to drawing FIG. 5C, the wire bond/band pad interface 158 is shown with the IMC growth in its mature, aged growth stage on the test chip 10. As shown, the IMC has consumed a substantial portion of the aluminum layer 156.

Figure 6A:
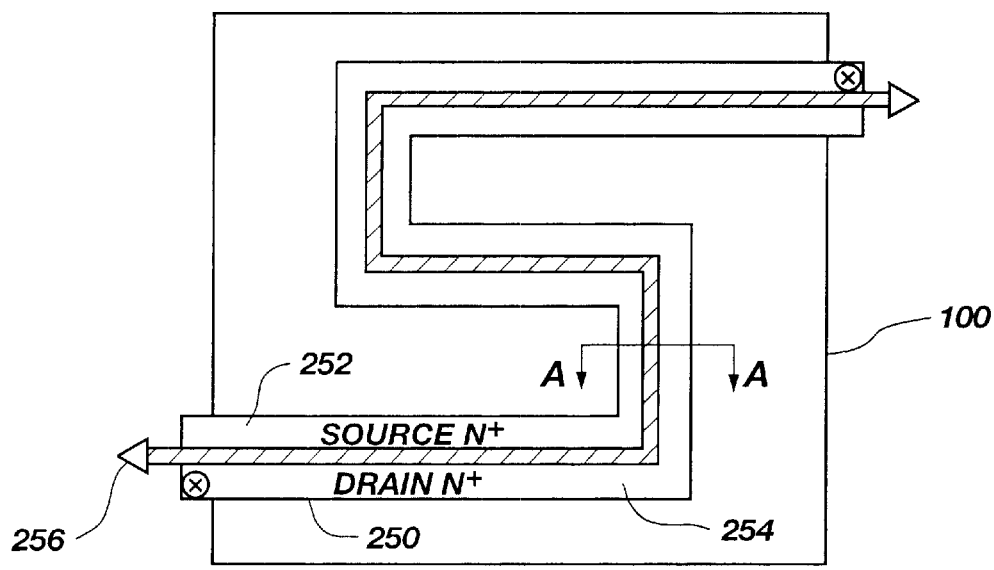
FIGS. 6A and 6B are views of an active circuit, such as a serpentine transistor, for use beneath a contact pad of the semiconductor test chip of the present invention.

Referring to drawing FIG. 6A, shown is a typical serpentine transistor structure located under a bond pad 100 and the like used to evaluate the damage or change in the polysilicon structure located below the metal bond pad 100 after wire bonding thereto. A serpentine transistor 250 is shown including an N+ source 252, an N+ drain 254 and polysilicon material 256 located under a metal bond pad 100. The N+ source 252, N+ drain 254, and polysilicon material 256 are connected to suitable adjacent bond pads for the measurement of the characteristics of the serpentine transistor 250 after the bonding of the wire to the bond pad 100.

Figure 6B:
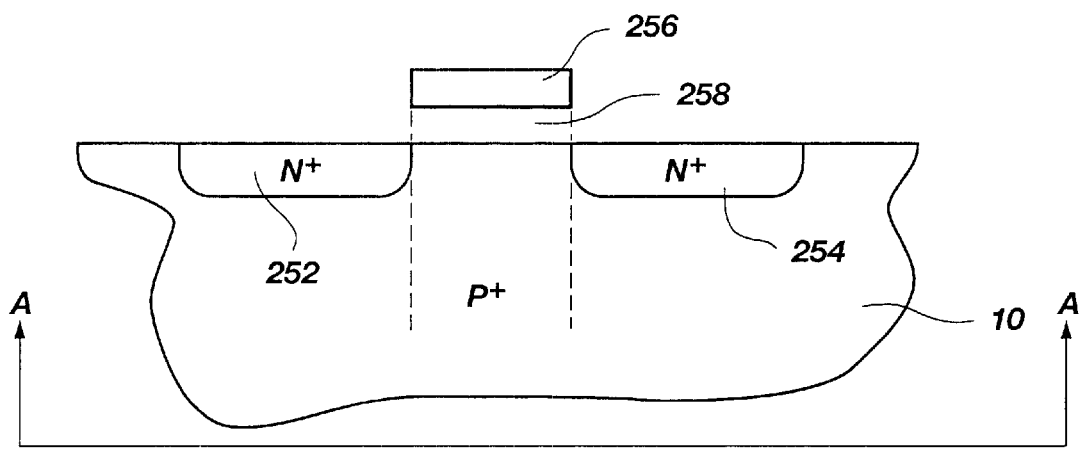

Referring to drawing FIG. 6B, a portion of the transistor is shown as taken through section line A—A of drawing FIG. 6A. The polysilicon material 256, N+ source 252 and N+ drain 254 are shown as well as a layer of field "ox" 258, typically silicon dioxide, located beneath the polysilicon material 256.

Figure 7:
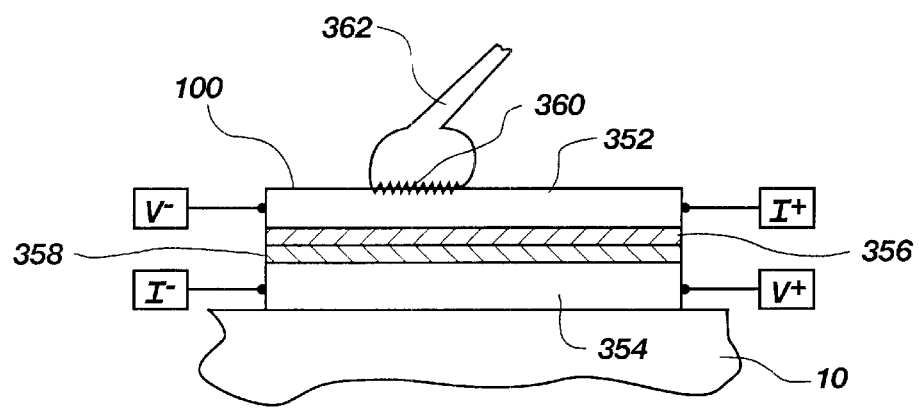
FIG. 7 is a cross-sectional view of a two metal layer contact pad including barrier films therebetween of the semiconductor test chip of the present invention.

Referring to drawing FIG. 7, a double metal layer bond pad 100 or the like is shown. The bond pad 100 is formed having a first metal layer 352, second metal layer 354, first coating 356 and second coating 358. The metal layers 352 and 354 of the bond pad 100 are electrically connected to suitable adjacent bond pads to measure the electrical characteristics of the metal layers as shown. The first coating 356 may comprise a suitable material, such as a 500 angstrom thick layer of titanium used as an anti-reflective coating (ARC). The second coating 358 may comprise a suitable coating, such as a 500 angstrom thick coating of titanium used as a contact barrier filler to prevent junction spiking. An IMC layer 360 is shown between the first metal layer 352 and the wire 362 bonded thereto. This double metal layer structure in the bond pad 100 allows the test chip 10 to measure, through the application of well known Kelvin electrical measurement techniques, the positive and negative effects of the interface of the two composite metal layers having the films located therebetween. This allows the evaluation of the anti-reflectance coatings, such as titanium nitride, titanium, etc. and the contact barrier films, such as titanium, as well as their reliability effects which are present interfacially under dynamic manufacturing conditions and their subsequent life characteristics. The IMC is affected by various thicknesses of the first metal layer 352 and will reach and consume any films at the interface of the metal layers 352 and 354, such as the coatings 358 and 356 at the interface. This type of test structure of a double layer bond pad on the test chip 10 allows interface potentials to be measured between the two metal layers whether the bond pad 100 has a wire bonded thereto or not.

Figure 8:
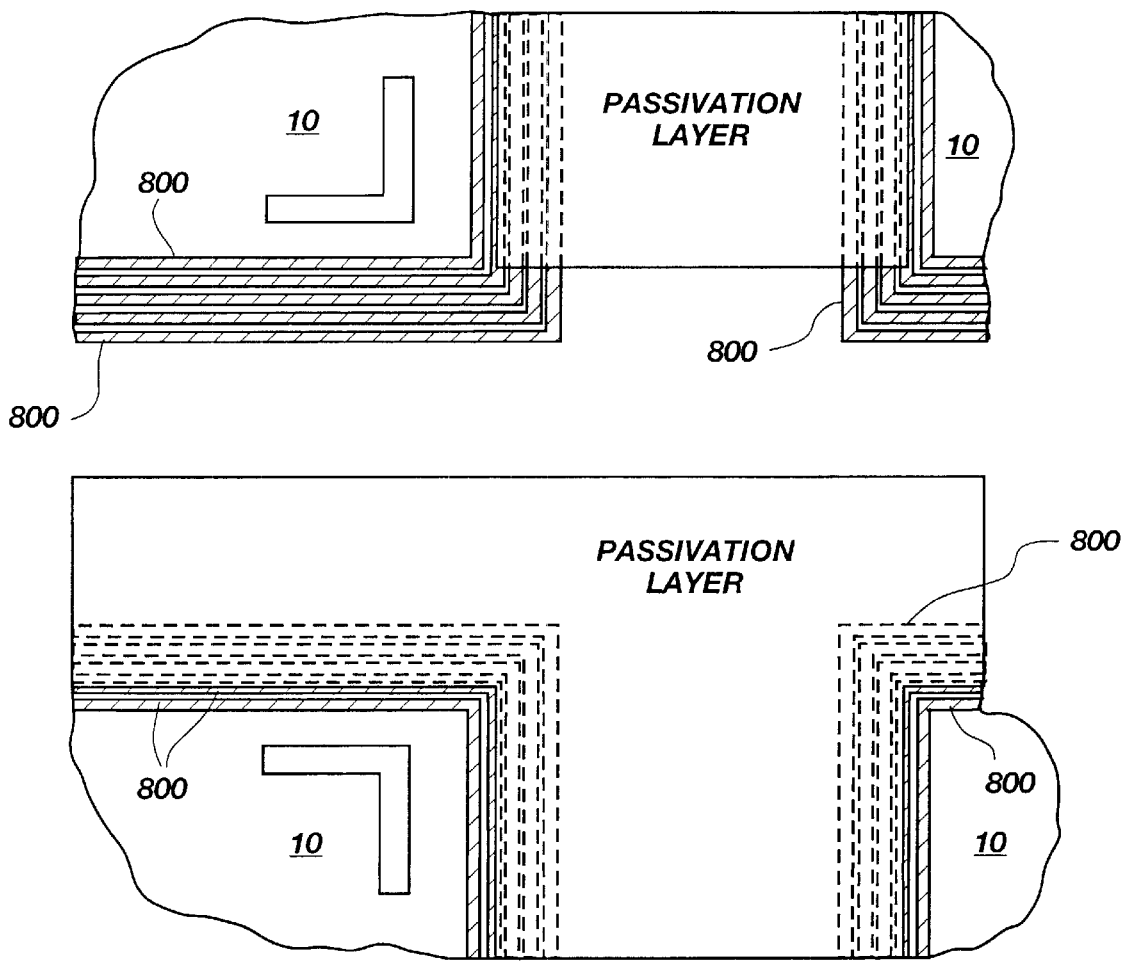
FIG. 8 is a view of line spacing about the periphery of the semiconductor test chip of the present invention.

Referring to drawing FIG. 8, the plurality of aluminum lines 800 extending around the street area of the test chip 10 is shown. The previously described spacings of the lines 800 of 4.0 mils, 4.5 mils, 5.0 mil, 5.5 mils and 6.0 mils from adjacent lines 800 of other test chips 10 formed on the same wafer are shown. As shown, the lines 800 in the shaded areas are passivated with a suitable coating. As the lines 800 are shown, as previously discussed herein, the effects of saw cuts on the chip 10 may be evaluated when the test chips 10 are separated from the wafer on which they are formed.

Figure 9A:
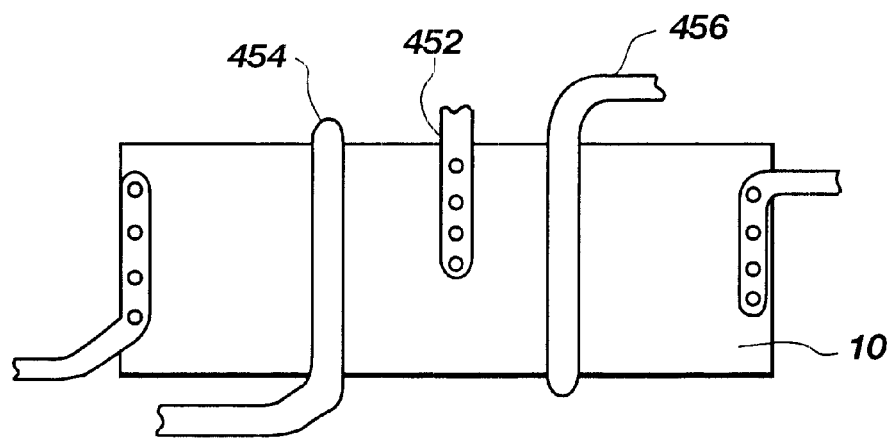
FIGS. 9A and 9B are views of a thin gate transistor and thick gate transistor circuitry of the semiconductor test chip of the present invention.
Figure 9B:
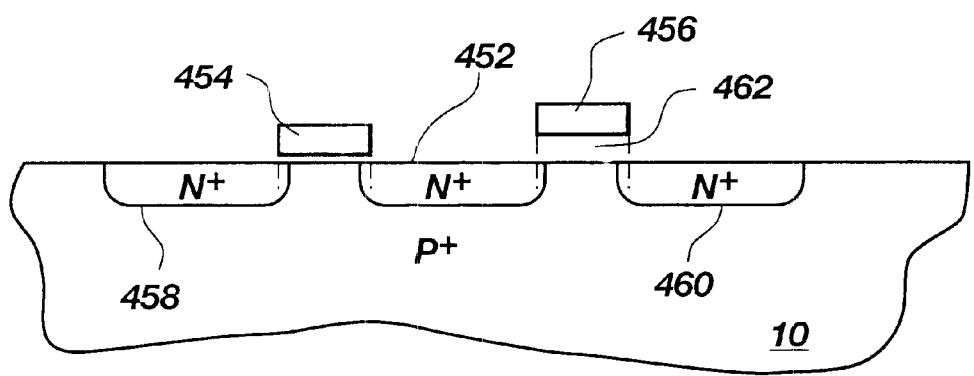

Referring to drawing FIGS. 9A and 9B, suitable thin and thick gate transistors are shown which are used as temperature sensors and contamination monitors in the test chip 10. As shown, a common source 452 N+ is used with a thin gate transistor 454 and thick gate transistor 456, having a common "FO" gate, in a test chip 10. As previously described hereinbefore, the FO gate 462 is field "ox," silicon dioxide, and the N+ 458 and 460 are drains for the thin and thick gate devices. By using the thin gate transistor, thick gate transistor, and PN junction temperature sensor, a system is formed that allows the measurement of the contamination in two different ranges or magnitudes while simultaneously correlating the mobility activity as a function of temperature, thereby allowing the user to realize or observe peak mobility activity versus temperature of the test chip 10. It is understood that the use of a two transistor system, a thin gate transistor and a thick gate transistor allows a broad range of measurements simultaneously. The thin gate transistor measures subtle concentrations while the thick gate transistor measures gross concentration. This approach yields a contamination measurement system that measures temperature and the mobility of ions of various concentration levels in situ.

It will be recognized that the test chip 10 of the present invention offers a variety of test capabilities for the testing of various semiconductor chip characteristics. While the test chip 10 has been described in general detail to illustrate its various testing capabilities, it may be modified to include only those capabilities of interest, or other test capabilities may be added or the number of existing testing capabilities may be enhanced. It will be appreciated that by using a square configuration of the test chip 10 of the present invention, the test chip 10 may be mounted in any desired position with respect to the lead frame. Typically, a 100 lead quad flat pack lead frame is used for the testing of the test chip 10 of the present invention. Also, it will be appreciated that the layout of the bond pads and the flip chip pads provide for the most compact geometric arrangement of the pads for the testing of the various functions of the test chip 10 and attachment to a tight pitch lead frame.

Therefore, it will be obvious to those of ordinary skill in the art that changes, additions, deletions and modifications to the test chip 10 of the present invention as disclosed herein may be made within the scope of the invention as hereinafter claimed.

What is claimed is:

1. A semiconductor chip for testing a plurality of functions thereof comprising:

a semiconductor chip including a periphery having at least four sides, a plurality of contact pads located substantially adjacent at least a portion of at least one side of the periphery of the semiconductor chip, at least a portion of the plurality of contact pads being located in a first row and a second row located substantially adjacent behind the first row on at least a portion of at least one side of the semiconductor chip, said plurality of contact pads including more than one geometric shape, and at least a portion of one conductive line located substantially in a scribe area extending about at least a portion of the periphery of the semiconductor chip.

2. The semiconductor chip of claim 1, wherein the plurality of contact pads is located in at least two rows substantially adjacent the periphery of the semiconductor chip on a portion of a periphery of at least a first side and a second side of the semiconductor chip.

3. The semiconductor chip of claim 1, wherein the plurality of contact pads is of at least three different geometric shapes.

4. The semiconductor chip of claim 1, wherein at least two of the contact pads of the plurality of contact pads differ in size.

5. The semiconductor chip of claim 1, wherein the plurality of contact pads includes contact pads having different pitches of mounting on the semiconductor chip.

6. The semiconductor chip of claim 1, wherein the semiconductor chip further includes:

a plurality of conductive lines located substantially in the scribe area of the semiconductor chip extending substantially throughout the periphery of the semiconductor chip.

7. The semiconductor chip of claim 1, wherein the semiconductor chip further includes:

a plurality of conductive lines located substantially in the scribe area of the semiconductor chip extending throughout a portion of the periphery of the semiconductor chip, at least two lines of the plurality of conductive lines having a width which differs from one another.

8. The semiconductor chip of claim 1, wherein the semiconductor chip further includes:

a plurality of conductive lines located substantially in the scribe area of the semiconductor chip extending throughout a portion of the periphery of the semiconductor chip, each line of the plurality of conductive lines having a spacing which differs from another line of the plurality of conductive lines.

9. The semiconductor chip of claim 1, wherein the plurality of contact pads is formed in a plurality of groups of contact pads, each group of contact pads extending substantially about one side of the periphery of the semiconductor chip.

10. The semiconductor chip of claim 1, wherein the plurality of contact pads is formed in a plurality of groups of contact pads extending substantially about the periphery of the semiconductor chip, each individual group of contact pads being of different size than another group of contact pads of the plurality of contact pads.

11. The semiconductor chip of claim 1, wherein the plurality of contact pads is formed in a plurality of groups of contact pads extending substantially about the portion of the periphery of the semiconductor chip, each group of the plurality of groups of contact pads including at least a first row of contact pads and at least a second row of contact pads located adjacent the at least a first row of contact pads.

12. The semiconductor chip of claim 1, wherein the semiconductor chip further includes:
a polysilicon area located under a portion of the plurality of contact pads.

13. The semiconductor chip of claim 1, wherein the semiconductor chip further includes:
an area of polysilicon located under a portion of the plurality of contact pads, the area of polysilicon having at least two differing configurations.

14. The semiconductor chip of claim 1, wherein the semiconductor chip further includes:
a plurality of resistive type heaters located on a portion of the semiconductor chip.

15. The semiconductor chip of claim 14, wherein each resistive type heater of the plurality of resistive type heaters is independently connected to a connector pad on the semiconductor chip.

16. The semiconductor chip of claim 1, wherein the semiconductor chip further includes:
a plurality of transistors to measure any temperature gradient in the semiconductor chip.

17. The semiconductor chip of claim 1, wherein the semiconductor chip further includes:
a plurality of thin gate and thick gate transistor devices for measurement of temperature or ion contamination of the semiconductor chip.

18. The semiconductor chip of claim 1, wherein the semiconductor chip further includes:
a plurality of resistors for measurement of thermal performance of a portion of the semiconductor chip and any package in which it is mounted.

19. The semiconductor chip of claim 1, wherein the semiconductor chip is substantially square in shape.

20. The semiconductor chip of claim 1, wherein the semiconductor chip further includes:
a plurality of flip chip test pads located substantially in a center portion of the semiconductor chip.

21. The semiconductor chip of claim 1, wherein the semiconductor chip further includes:
a plurality of flip chip test pads in an array located in substantially a center portion of the semiconductor chip.

22. The semiconductor chip of claim 1, wherein the semiconductor chip further includes:
a plurality of flip chip test pads located in substantially a center of the semiconductor chip, a portion of the plurality of flip chip test pads being connected in a daisy chain connection by conductors extending therebetween, the portion of the plurality of flip chip test pads being connected in the daisy chain connection being independent of other flip chip test pads of the plurality of flip chip test pads.

23. A semiconductor chip for testing comprising:
a semiconductor chip including a periphery formed by a plurality of sides, a plurality of contact pads located substantially adjacent a portion of the periphery of the semiconductor chip, the plurality of contact pads having a plurality of geometric shapes, the plurality of contact pads forming a plurality of groups of contact pads extending substantially about at least a portion of at least one side of the periphery of the semiconductor chip, each group of the plurality of groups of contact pads including at least a first row of contact pads and at least a second row of contact pads located adjacent the at least a first row of contact pads, a portion of the plurality of contact pads including active circuitry of the semiconductor chip.

24. The semiconductor chip of claim 23, wherein the plurality of contact pads is located in at least two rows substantially adjacent the periphery of the semiconductor chip on a portion of the periphery of at least one side of the semiconductor chip.

25. The semiconductor chip of claim 23, wherein the plurality of contact pads is of at least three different geometric shapes.

26. The semiconductor chip of claim 23, wherein at least two of the contact pads of the plurality of contact pads differ in size.

27. The semiconductor chip of claim 23, wherein the plurality of contact pads includes contact pads having different pitches of mounting on the semiconductor chip.

28. The semiconductor chip of claim 23, wherein the semiconductor chip further includes:
at least one line located substantially in a scribe area of the semiconductor chip extending about a portion of the periphery of the semiconductor chip.

29. The semiconductor chip of claim 23, wherein the semiconductor chip further includes:
a plurality of lines located substantially in the scribe area of the semiconductor chip extending substantially throughout the periphery of the semiconductor chip.

30. The semiconductor chip of claim 23, wherein the semiconductor chip further includes:
a plurality of lines located substantially in the scribe area of the semiconductor chip extending throughout a portion of the periphery of the semiconductor chip, at least two lines of the plurality of lines having a width which differs from another line of the plurality of lines.

31. The semiconductor chip of claim 23, wherein the semiconductor chip further includes:
a plurality of lines located substantially in the scribe area of the semiconductor chip extending throughout a portion of the periphery of the semiconductor chip, each line of the plurality of lines having a spacing which differs from another line of the plurality of lines.

32. The semiconductor chip of claim 23, wherein the plurality of contact pads is formed in the plurality of groups of contact pads, each group of contact pads extending substantially about one side of the periphery of the semiconductor chip.

33. The semiconductor chip of claim 23, wherein the plurality of contact pads formed in the plurality of groups of contact pads extends substantially about the periphery of the semiconductor chip, each individual group of contact pads being of a different size than another group of contact pads of the plurality of contact pads.

34. The semiconductor chip of claim 23, wherein the semiconductor chip further includes:
a polysilicon area located under at least a portion of the plurality of contact pads.

35. The semiconductor chip of claim 23, wherein the semiconductor chip further includes:
an area of polysilicon located under a portion of the plurality of contact pads, the area of polysilicon having at least two differing configurations.

36. The semiconductor chip of claim 23, wherein the semiconductor chip further includes:

a plurality of resistive type heaters located on a portion of the semiconductor chip.

37. The semiconductor chip of claim 36, wherein each resistive type heater of the plurality of resistive type heaters is independently connected to a connector pad on the semiconductor chip.

38. The semiconductor chip of claim 23, wherein the semiconductor chip further includes:

a plurality of transistors to measure any temperature gradient in the semiconductor chip.

39. The semiconductor chip of claim 23, wherein the semiconductor chip further includes:

a plurality of thin gate and thick gate transistor devices for measurement of temperature or ion contamination of the semiconductor chip.

40. The semiconductor chip of claim 23, wherein the semiconductor chip further includes:

a plurality of resistors for measurement of thermal performance of a portion of the semiconductor chip and any package in which it is contained.

41. The semiconductor chip of claim 23, wherein the semiconductor chip is substantially square in shape.

42. The semiconductor chip of claim 23, wherein the semiconductor chip for testing further includes:

a plurality of flip chip test pads located substantially in a center portion of the semiconductor chip.

43. The semiconductor chip of claim 23, wherein the semiconductor chip further includes:

a plurality of flip chip test pads in an array located in substantially a center portion of the semiconductor chip.

44. The semiconductor chip of claim 23, wherein the semiconductor chip further includes:

a plurality of flip chip test pads located in substantially a center of the semiconductor chip, a portion of the plurality of flip chip test pads being connected in a daisy chain connection by conductors extending therebetween, the portion of the plurality of flip chip test pads being connected in the daisy chain connection being independent of other flip chip test pads of the plurality of flip chip test pads.

* * * * *